(12) United States Patent
Mauthe et al.

(10) Patent No.: US 11,056,856 B2
(45) Date of Patent: Jul. 6, 2021

(54) PLASMONIC LASER

(71) Applicant: INTERNATIONAL BUSINESS MACHINES CORPORATION, Armonk, NY (US)

(72) Inventors: Svenja Mauthe, Zurich (CH); Kirsten Emilie Moselund, Rüschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 168 days.

(21) Appl. No.: 16/274,277

(22) Filed: Feb. 13, 2019

(65) Prior Publication Data
US 2020/0259312 A1 Aug. 13, 2020

(51) Int. Cl.
*H01S 5/10* (2021.01)
*H01S 3/063* (2006.01)
(Continued)

(52) U.S. Cl.
CPC .......... *H01S 5/1046* (2013.01); *H01S 3/0632* (2013.01); *H01S 5/026* (2013.01);
(Continued)

(58) Field of Classification Search
CPC .... H01S 5/1046; H01S 3/0632; H01S 5/1042; H01S 5/3401; H01S 5/3059;
(Continued)

(56) References Cited

U.S. PATENT DOCUMENTS 8,426,224 B2 4/2013 Wang et al.
8,509,276 B2 8/2013 Zhang et al.
(Continued)

FOREIGN PATENT DOCUMENTS

CA 2645416 C 2/2017
CN 104242021 A 12/2014

OTHER PUBLICATIONS

Huang et al., "Electrically Driven Subwavelength Optical Nanocircuits," Nature Photonics 8.3, Feb. 23, 2014, pp. 1-6.
(Continued)

*Primary Examiner* — Xinning(Tom) Niu
(74) *Attorney, Agent, or Firm* — Cantor Colburn LLP; Daniel Morris (57) ABSTRACT

Embodiments of the invention relate to a plasmonic laser including a substrate and a coaxial plasmonic cavity formed on the substrate and adapted to facilitate a plasmonic mode. The plasmonic laser further includes an electrical pumping circuit configured to electrically pump the plasmonic laser. The coaxial plasmonic cavity includes a peripheral plasmonic ring structure, a central plasmonic core and a gain structure arranged between the peripheral plasmonic ring structure and the central plasmonic core. The gain structure includes one or more ring-shaped quantum wells as gain material. The one or more ring-shaped quantum wells have a surface that is aligned orthogonal to a surface of the substrate. The electrical pumping circuit is configured to pump the plasmonic laser via the peripheral plasmonic ring structure and the central plasmonic core.

20 Claims, 8 Drawing Sheets

(51) Int. Cl.
    *H01S 5/34*              (2006.01)
    *H01S 5/30*              (2006.01)
    *H01S 5/042*           (2006.01)
    *H01S 5/026*           (2006.01)

(52) U.S. Cl.
    CPC .......... *H01S 5/0425* (2013.01); *H01S 5/1042* (2013.01); *H01S 5/3059* (2013.01); *H01S 5/3401* (2013.01)

(58) Field of Classification Search
    CPC ........ H01S 5/0425; H01S 5/026; H01S 5/021; H01S 2301/176; H01S 5/34313; H01S 5/04256; H01S 5/04257; H01S 5/3428; H01S 5/1075
    See application file for complete search history.

(56) References Cited

U.S. PATENT DOCUMENTS

| | | | |
|---|---|---|---|
| 8,989,232 B2 | 3/2015 | Khajavikhan et al. | |
| 9,318,866 B2 | 4/2016 | Bora et al. | |
| 9,356,427 B2* | 5/2016 | Lee | H01S 5/04252 |
| 9,667,032 B1 | 5/2017 | Li et al. | |
| 9,748,736 B1 | 8/2017 | Ma et al. | |
| 2013/0070799 A1* | 3/2013 | Lee | G02B 6/1226 372/45.01 |
| 2014/0054475 A1* | 2/2014 | Khajavikhan | H01S 5/30 250/552 |
| 2017/0141535 A1* | 5/2017 | Li | H01S 5/34346 |

OTHER PUBLICATIONS

Khajavikhan et al., "Design and development of electrically pumped coaxial nanoscale laser for on-chip optical communication—Topic STIR," University of Central Florida Orlando, Aug. 31, 2015, pp. 1-16.

Khajavikhan et al., "Thresholdless nanoscale coaxial lasers," Nature, vol. 482, Feb. 9, 2012, pp. 204-207.

Lu et al., "Nanopillar quantum well lasers directly grown on silicon and emitting at silicon-transparent wavelengths," Optical Society of America Journal, vol. 4, No. 7, Jun. 23, 2017, pp. 1-7.

Stettner et al., "Coaxial GaAs—AlGaAs core-multishell nanowire lasers with epitaxial gain control," Appl. Phys. Lett. 108, 011108, Jan. 5, 2016, pp. 1-6.

* cited by examiner

PLASMONIC LASER

BACKGROUND

Embodiments of the invention relate generally to a plasmonic laser and a fabrication method for a plasmonic laser.

Optical devices are often formed on III-V substrates due to their direct and tunable bandgap, which allows for radiative recombination and hence light emission. Laser devices may be formed on a separate substrate from the Si electronics substrate with field effect transistors. This approach is useful for applications requiring fewer high-performance emitters, and where the footprint or integration density of the photonic components is not the main concern.

It has been a long-standing vision to combine the high-speed, frequency multiplexed performance of photonics with the integration densities of electronics, and in recent years, there has been a great interest in nanoscale lasers integrated on Si. In reality these cavities are on the order of a few to sub-micron sized cavities, but are nevertheless often referred to as nanolasers. These devices are interesting for a number of applications ranging from optical on-chip data communications to sensing and bio-applications. Using conventional photonic cavities the diffraction limit of light imposes a lower bound on dimensional scaling of $\lambda/2n$–half the wavelength of light in the medium. For cavities smaller than this light will simply leak out and escape from the cavity. In order to achieve subwavelength confinement, metallic plasmonic cavities are considered, as plasmonic modes allow for the confinement of light below the diffraction limit. But, this confinement comes at the cost of high optical absorption losses as part of the mode resides in the metal. For a purely plasmonic mode cavity, there is in principle no lower bound on the geometrical scaling, although excessive loss will impose a practical limit. It is also possible to reduce losses, in practical applications by separating the metal from the semiconductor gain medium by a thin dielectric layer. These structures are often referred to as hybrid photonic-plasmonic.

In order to facilitate applications of nanoscale lasers for on-chip communication as well as for other integrated applications, electrically pumped nanoscale lasers are desired.

SUMMARY

According to a first aspect, the invention is embodied as a plasmonic laser comprising a substrate and a coaxial plasmonic cavity which is formed on the substrate and adapted to facilitate a plasmonic mode. The plasmonic laser comprises an electrical pumping circuit configured to electrically pump the plasmonic laser. The coaxial plasmonic cavity comprises a peripheral plasmonic ring structure, a central plasmonic core and a semiconductor gain structure which is arranged between the peripheral plasmonic ring structure and the central plasmonic core. The gain structure comprises one or more radial quantum wells as gain material. The one or more radial quantum wells have a surface that is aligned orthogonal to a surface of the substrate. Furthermore, the electrical pumping circuit is configured to pump the plasmonic laser via the peripheral plasmonic ring structure and the central plasmonic core.

Hence embodiments of the invention provide a coaxial laser, in particular a coaxial nanolaser, based on a coaxial plasmonic cavity that can be electrically pumped. The coaxial plasmonic cavity is embodied as a cavity that facilitates the excitation of surface plasmons, wherein lateral surfaces of the peripheral plasmonic ring structure and the central plasmonic core structure are arranged coaxial to each other. Such an arrangement allows to provide lateral (on the side) electrical contacts to the peripheral and central plasmonic cores and hence an efficient way to pump the plasmonic laser electrically. The peripheral and the central plasmonic core provide two functionalities. On the one hand they act as plasmonic cavity and on the other hand they serve as electrical contacts for the electrical pumping of the laser. Hence embodiments of the invention facilitate the integration of such a coaxial laser with electronic circuitry. This may allow a variety of applications including VLSI integration.

The radial quantum wells of the plasmonic laser encircle the central plasmonic core and the surface of the quantum wells are integrated orthogonal to a surface of the substrate. According to embodiments the quantum wells can be laterally, more particularly radially aligned or in other words laterally, in particular radially positioned along the diameter of the gain structure to provide a maximum overlap with the modes of the plasmonic laser. This further facilitates the efficiency of the pumping.

The term "laterally" is used in this context, as is customary, to indicate orientation generally parallel to the plane of the substrate, as opposed to vertically or orthogonally to the surface of the substrate.

According to embodiments, the expression that the quantum wells have a surface that is aligned orthogonal to the surface of the substrate shall mean that the quantum wells extend in a coaxial direction of the plasmonic cavity that is orthogonal (perpendicular) to the surface of the substrate, wherein orthogonal shall include also small deviations from a 90° angle as may arise e.g. from fabrication tolerances or for other reason. According to embodiments, orthogonal shall include angles within about 5% of a 90° angle. According to other embodiment, orthogonal shall include angles within 4, 3, 2, or 1% of a 90° angle.

According to embodiments, a radial quantum well shall be understood as a quantum well that encircles the central plasmonic core. According to embodiments it can take on various shapes such as circular or hexagonal. In particular, it is embedded within the gain medium and not directly in contact with the outer plasmonic ring. The lateral position of the radial quantum well within the gain medium can be tuned freely as to maximize an overlap of the plasmonic mode and the free carriers in the quantum wells. The number of radial quantum wells may depend on the materials used, and the ensuing strain. According to embodiments, 1 to 10 quantum wells are provided. According to embodiments, the gain structure comprises a doping profile adapted to form a pin-structure.

According to such an embodiment, a pin-doping profile is implemented in the semiconductor gain structure, such that the peripheral plasmonic ring structure is connected to either a p- or an n-doped region, and the central core is connected to the opposite polarity. Such an electrical configuration facilitates an electrical pumping scheme.

A pin-structure is a structure having an intrinsic region arranged between a p-doped region and a n-doped region.

An intrinsic region shall be understood as a region having a Fermi-level close to the center of the energy gap, and being non-conducting electrically. In commonly used semiconductors this will correspond to doping densities up to about $10^{15}$-$10^{16}$ cm$^{-3}$.

A p-doped region and a n-doped region shall be understood as regions having a Fermi-level close to or with the valance and conduction band, respectively. In commonly used semiconductors this will correspond to doping densities of around/about $10^{18}$-$10^{20}$ cm$^{-3}$.

According to embodiments the peripheral plasmonic ring structure and the central plasmonic core are configured to facilitate the excitation and sustention of surface plasmons. Such surface plasmons are electron oscillations at the surface of the plasmonic ring structure and the gain structure as well as at the interface between the central plasmonic core and the gain structure.

According to embodiments, the plasmonic laser is configured to generate surface plasmon polaritons. Such surface plasmon polaritons (SPPs) are electromagnetic waves that travel along an interface of a plasmonic metal and a dielectric material, more particularly along the interface between the plasmonic ring structure and the gain structure as well as along the interface between the central plasmonic core and the gain structure. As dimensions are shrunk at the two surfaces approaching each other, their respective fields may overlap. Surface plasmons denote electron oscillations or in other words charge motions at the interface between the plasmonic ring structure and the gain structure as well as at the interface between the central plasmonic core and the gain structure. The term polariton denotes the associated electromagnetic waves that travel in the gain structure, in particular in the quantum wells. In this respect the peripheral plasmonic ring structure and the central plasmonic core are configured to facilitate the excitation of the surface plasmons. Such an excitation may be in particular fostered by the materials of the peripheral plasmonic ring structure, the central plasmonic core and the adjacent gain structure.

According to embodiments, the peripheral plasmonic ring structure and the central plasmonic core comprise a metal or a doped semiconductor material, in particular a degenerately doped semiconductor material. Such materials facilitate the excitation of surface plasmons, in particular in combination with the material of the adjacent gain structure which serves as dielectric.

According to embodiments, the plasmonic laser is configured to generate plasmonic whispering gallery modes. The generation of these whispering gallery modes, which may also be denoted as whispering-gallery waves, is facilitated by the coaxial plasmonic cavity and the ring-shaped quantum wells.

The central plasmonic core may be embodied as metal plug, i.e. as a plug that fully consists of a metal. This facilitates ease of manufacturing as well as the provision of contacts between the metal plug and the electrical pumping circuit.

According to embodiments, the one or more quantum wells are formed by one or more quantum well layers of a second group III-V semiconductor material, while the one or more quantum well layers are embedded within cladding layers of a first group III-V semiconductor material. The first group III-V semiconductor material and the second group III-V semiconductor material have a different bandgap to provide quantum confinement. In particular, the first group III-V semiconductor material of the cladding layers has a larger bandgap than the second semiconductor material of the quantum layer. One suitable combination of the first and the second group III-V semiconductor materials include InP as first semiconductor material of the cladding layers and InAlGaAs as second semiconductor material of the quantum wells. Other suitable combinations encompass AlGaAs combined with GaAs and GaAs combined with InGaAs.

The group III-V materials may be generally binary as well as ternary or quarternary materials.

According to other embodiments, appropriate pairs of group II-VI semiconductor compounds, mixed II-VI compounds, and IV-VI compounds may be used.

The gain structure may comprise according to embodiments a positively doped semiconductor layer of a first semiconductor material and a negatively doped semiconductor layer of the first semiconductor material. Furthermore, the one or more quantum wells are arranged between the positively doped semiconductor layer and the negatively doped semiconductor layer and the quantum wells comprise a second semiconductor material that is different from the first semiconductor material. The positively doped semiconductor layer and the negatively doped semiconductor layer establish together with the gain structure a pin-junction of a diode of the plasmonic laser.

According to embodiments, the plasmonic laser is configured to generate a hybrid plasmonic-photonic mode. Such a plasmonic laser may be formed in particular by a laser that comprises a thin oxide layer between the peripheral plasmonic ring structure and the gain structure. A hybrid mode may be defined as a mode in which the polaritons of the SPP mode carry more energy than the plasmons of the SPP mode. In other words, in a hybrid plasmonic mode the energy of the optical part of the SPP mode is higher than the energy that is carried by the plasmons of the mode.

According to an embodiment of another aspect of the invention there is provided a method for fabricating a plasmonic laser. The method comprises steps of providing a semiconductor substrate, forming an insulating layer on the semiconductor substrate and forming an opening in the insulating layer. Thereby a seed surface of the semiconductor substrate is exposed. The method comprises a further step of forming a template structure above the insulating layer. The template structure encompasses a template cavity comprising the opening. The method comprises further steps of epitaxially growing from the seed surface a gain structure in the template structure and selectively removing the template structure. Further steps include forming a central hole in the gain structure, forming a central plasmonic core structure in the central hole and forming a peripheral plasmonic ring structure all around a vertical edge of the gain structure.

Such a method allows an efficient and reliable fabrication of coaxial plasmonic lasers that can be electrically pumped.

In particular, by changing the type and ratio of precursors during the growth, doping profiles as well as heterojunctions and quantum wells may be implemented radially within the gain structure.

According to embodiments, the step of growing the gain structure comprises growing one or more ring-shaped quantum wells in the template cavity.

According to embodiments, the step of growing the gain structure comprises steps of radially growing in the template cavity a first doped semiconductor layer of a first semiconductor material, growing in the template cavity a quantum well layer of a second semiconductor material on the first doped semiconductor layer and growing in the template cavity a second doped semiconductor layer of the first semiconductor material.

According to embodiments, the method comprises steps of growing a plurality of quantum well layers by growing sequentially in the template cavity in an alternating way a plurality of semiconductor layers of a first semiconductor material and a plurality of quantum well layers of a second semiconductor material. The first semiconductor material is different from the second semiconductor material and has in particular a different bandgap than the second semiconductor material.

The growing of the gain structure may be generally performed by any suitable epitaxial process, in particular by metal organic chemical vapor deposition (MOCVD), atmospheric pressure CVD, low or reduced pressure CVD, ultrahigh vacuum CVD, molecular beam epitaxy (MBE), atomic layer deposition (ALD) or hydride vapor phase epitaxy.

Fabrication methods according to embodiments of the invention further facilitate an efficient and reliable provision of electrical pumping circuits and corresponding electrical contacts. Such embodied method may include steps of forming an electrical pumping circuit, providing an electrical connection between the electrical pumping circuit and the peripheral plasmonic ring structure and providing an electrical connection between the electrical pumping circuit and the central plasmonic core.

According to embodiments, the width of the quantum wells in a lateral growth direction may be controlled via one or more growth parameters of the epitaxial growth. A growth parameter may be any parameter that is suitable to control growth of the quantum wells. One suitable parameter is the time of the epitaxial growth. With such an embodied method the width of the quantum wells in the lateral direction may be precisely controlled and fabricated in a reliable and efficient way. Suitable widths of the quantum wells are in a range between about 3 nm and about 20 nm.

The steps of the different aspects of the invention may be performed in different orders as appropriate. Furthermore, the steps may also be combined as appropriate, i.e. that e.g. two or more steps may be performed together.

Advantages of the features of one aspect of the invention may apply to corresponding features of another aspect of the invention.

Embodiments of the invention will be described in more detail below, by way of illustrative and non-limiting examples, with reference to the accompanying drawings.

DETAILED DESCRIPTION

Figure 1:
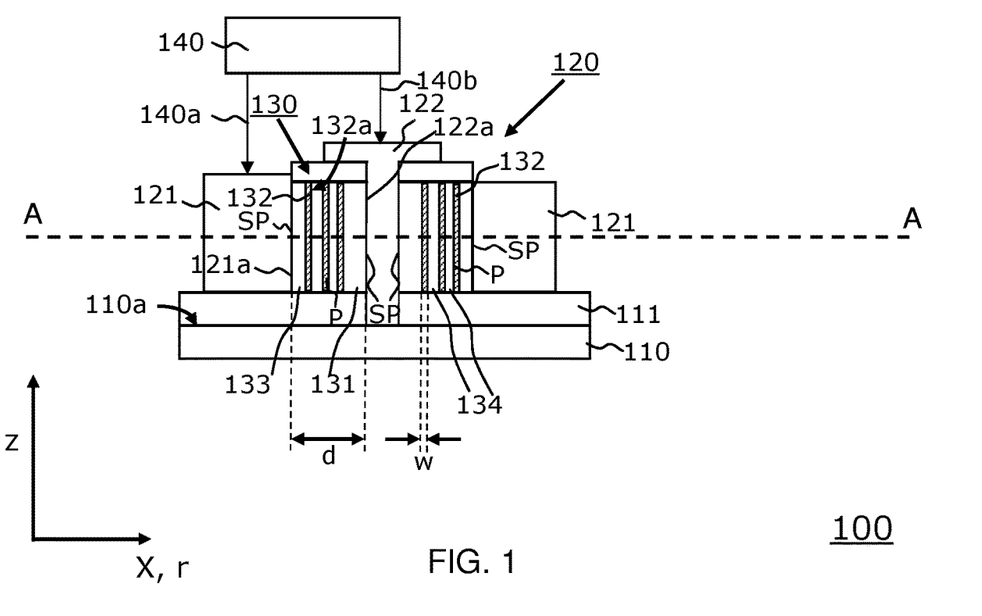
FIG. 1 shows a schematic cross-sectional view of a plasmonic laser according to an embodiment of the invention.
Figure 2:
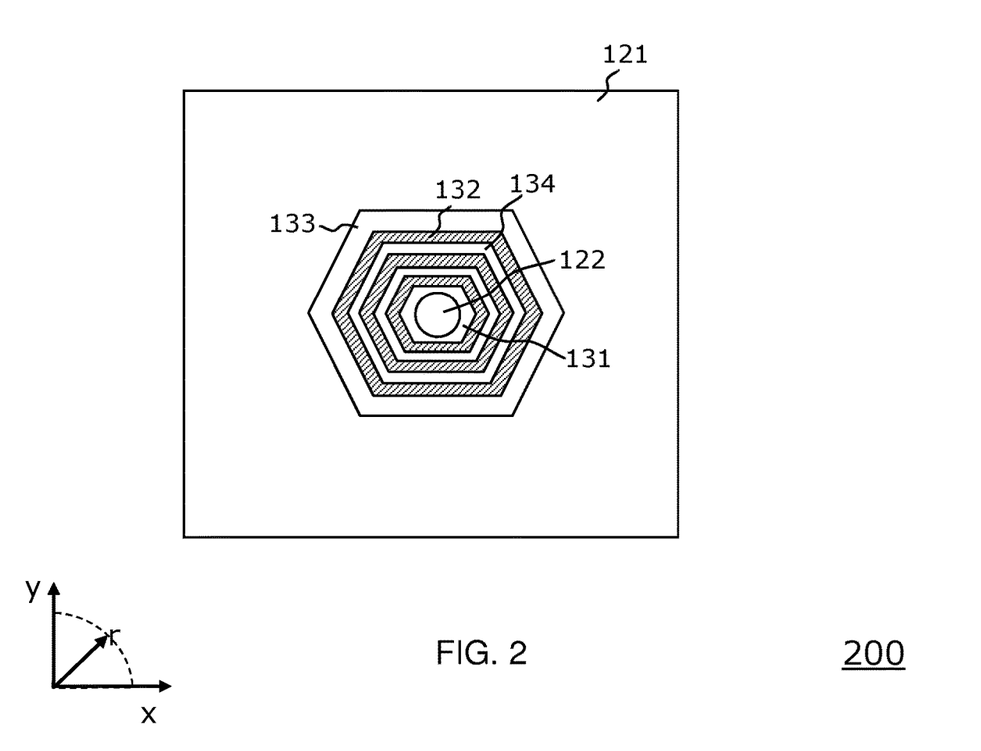
FIG. 2 shows a corresponding cross-sectional view taken along line A-A of FIG. 1.

FIG. 1 shows a schematic cross-sectional view of a plasmonic laser 100 according to embodiment of the invention. FIG. 2 shows a corresponding cross sectional view taken along the line A-A of FIG. 1.

The plasmonic laser 100 comprises a substrate 110 and an insulating layer 111 formed on the substrate 110. The plasmonic laser 100 further comprises a coaxial plasmonic cavity 120 which is formed on or in other words above the substrate 100 and adapted to facilitate a plasmonic mode. The coaxial plasmonic cavity comprises a peripheral plasmonic ring structure 121 and a central plasmonic core 122. The central plasmonic core may be in particular embodied as a plug, e.g. as a metal plug. The plasmonic cavity 100 further comprises a gain structure 130 which is arranged between the peripheral plasmonic ring structure 121 and the central plasmonic core 122. The gain structure 130 comprises one or more radial quantum wells 132 as gain material. The one or more radial quantum wells 132 have a surface 132a that is aligned orthogonal to a surface 110a of the substrate 110.

The plasmonic laser 100 further comprises an electrical pumping circuit 140 configured to electrically pump the plasmonic laser 100 via the peripheral plasmonic ring structure 121 and the central plasmonic core 122. Hence the peripheral plasmonic ring structure 121 and the central plasmonic core 122 serve as electrodes for the pumping circuit 140 in order to pump the gain structure 130.

The peripheral plasmonic ring structure 121 and the central plasmonic core 122 are metallic or plasmonic metal-like structures. Accordingly the peripheral plasmonic ring structure 121 and the central plasmonic core 122 may comprise a metal, in particular Au, Ag or a metal nitride like TiN, TaN, ZrN or a degenerately doped semiconductor A plasmonic metal-like structure shall be understood as a structure that has similar properties as a metal, in particular a similar conductivity and which presents a negative real part of the dielectric permittivity at the wavelength of operation of the laser. According to embodiments, the peripheral plasmonic ring structure 121 and the central plasmonic core 122 may comprise a doped semiconductor material, in particularly a highly doped semiconductor material. In general the peripheral plasmonic ring structure 121 and the central plasmonic core 122 may comprise any material that facilitates the excitation of surface plasmons.

The gain structure 130 comprises a p-type doped semiconductor layer 131 of a first semiconductor material, in particular a first group III-V semiconductor material, and a n-type doped semiconductor layer 133 of the first semiconductor material. As an example, the semiconductor layer 131 may be a layer of p-doped InP and the semiconductor layer 133 may be a layer of n-doped InP. The one or more quantum wells 132 are formed by one or more quantum well layers 132 and are arranged between the positively doped semiconductor layer 131 and the negatively doped semiconductor layer 133. The quantum wells 132 are illustrated by a diagonal pattern. The quantum wells 132 comprise a second semiconductor material that is different from the first semiconductor material, in particular a second group III-V semiconductor material with a direct bandgap. As an example, the quantum wells 132 may comprise intrinsic InGaAs. Between the plurality of quantum wells 132 there are arranged semiconductor layers 134 of the first semiconductor material, e.g. semiconductor layers of intrinsic InP. The positively doped semiconductor layer 131, the negatively doped semiconductor layer 133 and the semiconductor layers 134 form cladding layers for the quantum wells 132. The first semiconductor material of the cladding layers, i.e. of the semiconductor layer 131, the semiconductor layer 133 and the semiconductor layers 134 have a different bandgap than the second semiconductor material of the quantum wells 132. Some suitable combinations of the first group III-V semiconductor material and the second group III-V semiconductor material encompass the pair of InP and InGaAs, the pair of AlGaAs and GaAs and the pair of GaAs and InGaAs.

The quantum wells 132 have generally a radial shape following the shape of the semiconductor gain material crystal, in particular and according to the embodiment of FIGS. 1 and 2 it takes on a hexagonal shape. The hexagonal shape according to the illustrated embodiment results from the growth of the gain structure 130 from a seed surface of appropriate substrate. This will be described later in more detail.

The peripheral plasmonic ring structure 121 and the central plasmonic core 122 are configured to facilitate the excitation of surface plasmons SP. More particularly, the peripheral plasmonic ring structure 121 excites surface plasmons SP on its surface 121a towards the gain structure 130 and the central plasmonic core 122 excites surface plasmons SP on its surface 122a towards the gain structure 130. More particularly, the surface plasmon in the peripheral plasmonic ring structure 121 and the core plasmonic structure couples to photons in the gain structure 130 forming a surface plasmon polariton at the surfaces 121a and 122a.

The plasmonic laser 100 is furthermore configured to generate photons in the gain structure 130 and in particular in the quantum wells 132. The surface plasmons SP and the photon are coupled to each other forming a polariton. As a result, the plasmonic laser 100 generates surface plasmon polaritons SPP.

The surface plasmon polaritons SPP which are generated by the plasmonic laser 100 in the gain structure 130 are in particular whispering gallery modes. Such whispering-gallery modes, which may also be denoted as whispering-gallery waves, are a type of wave that travels around the circular gain structure 130, in particular within the circular quantum wells 132.

The plasmonic cavity 120 can include a diameter d in a radial r-direction between about 100 nm and about 2μ. The one or more quantum wells have a width w in the radial r-direction between about 5 nm and about 20 nm.

The plasmonic laser 100 may comprise further structures (not shown) such as underlying waveguides or resonant structures for coupling the emitted light. Such structures for coupling the light depend on the respective application.

FIGS. 3a-13c show successive stages of a method for fabricating a plasmonic laser according to embodiments of the invention.

FIGS. 3a-13c generally show enlarged cross-sectional views, top views and 3-dimensional views of initial, intermediate and final structures formed during the stages of the fabrication method. In any or all of the figures the dimensions may not be drawn to scale and may be shown in a simplified and schematic way to illustrate the features and principles of embodiments of the invention.

Figure 3A:
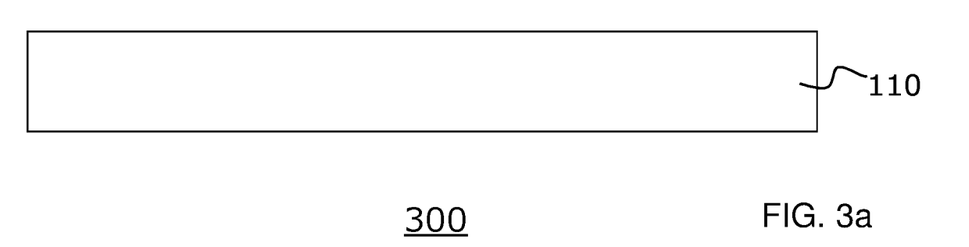
FIG. 3a illustrates a cross sectional view of an initial structure of a method for fabricating a plasmonic laser.
Figure 3B:
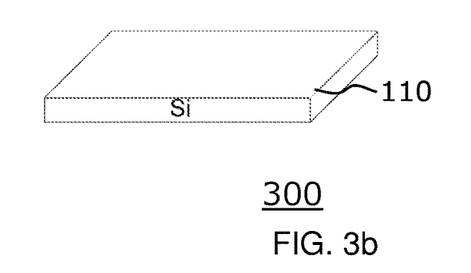
FIG. 3b shows a corresponding 3-dimensional view.

FIG. 3a illustrates a cross sectional view of an initial structure 300, and FIG. 3b shows a corresponding 3-dimensional view. The initial structure 300 is a substrate 110. The substrate 110 comprises a semiconductor material and may be e.g. a bulk semiconductor substrate. The substrate 110 may be embodied as a crystalline semiconductor or a compound semiconductor wafer of a large diameter. The substrate may comprise, for example, a material from group IV of the periodic table as semiconductor material. Materials of group IV include, for example, silicon, germanium, mixed silicon and germanium, mixed silicon and carbon, mixed silicon germanium and carbon and the like. For example, the substrate 110 may be a crystalline silicon wafer that is used in the semiconductor industry.

Figure 4A:
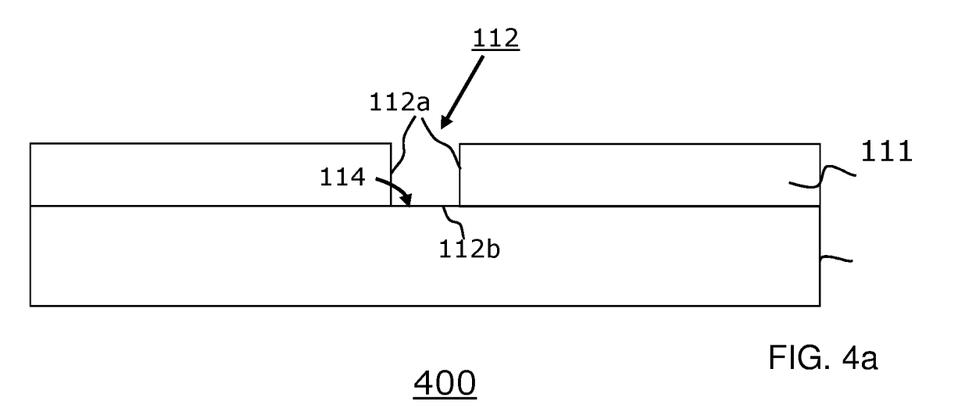
FIG. 4a illustrates a cross sectional view of a structure comprising an insulating layer on the substrate and an opening formed in the insulating layer.
Figure 4B:
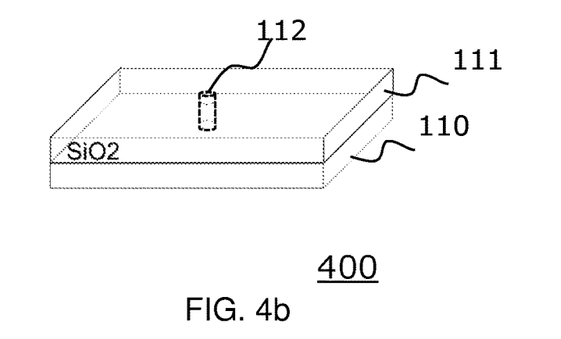
FIG. 4b shows a corresponding 3-dimensional view.

FIG. 4a illustrates a cross sectional view of a structure 400 comprising an insulating layer 111 on the substrate 110 and FIG. 4b a corresponding 3-dimensional view. The insulating layer 111 may be embodied e.g. as a dielectric layer. The insulating layer 111 can be formed by known methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials and combinations including multilayers thereof.

The thicknesses of the substrate 110 and the insulating layer 111 can be any suitable thicknesses.

The insulating layer 111 of the structure 400 comprises an opening 112 which has been formed in the insulating layer 111. The opening 112 has sidewalls 112a and a bottom 112b. The bottom 112b corresponds to a seed surface 114 of the substrate. The formation of the opening 112 may be performed by lithography and subsequent wet or dry etching techniques.

Figure 5A:
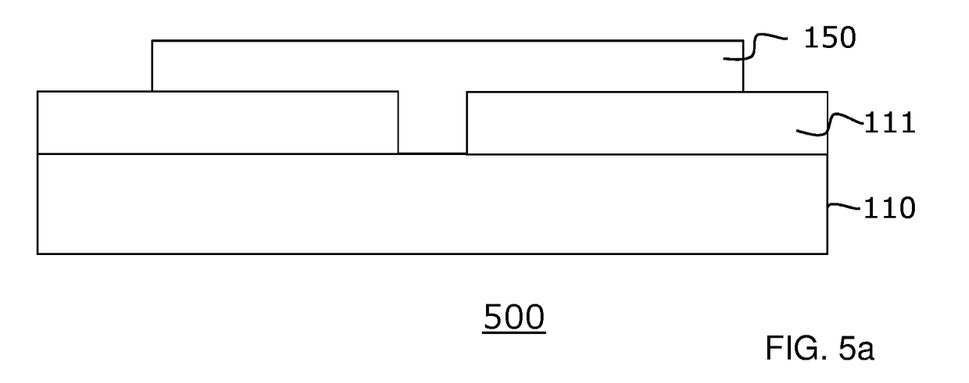
FIG. 5a illustrates a cross sectional view of a structure after a sacrificial structure has been formed on the insulating layer.
Figure 5B:
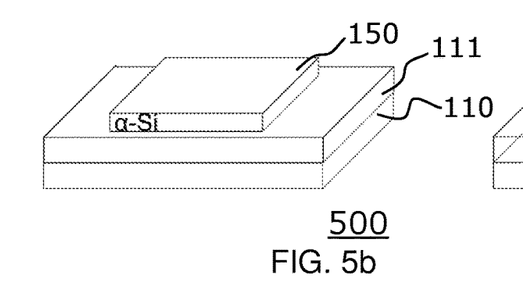
FIG. 5b shows a corresponding 3-dimensional view.

FIG. 5a illustrates a cross sectional view of a structure 500 after a sacrificial structure 150 has been formed on the insulating layer 111 including the opening 112. FIG. 3b shows a corresponding 3-dimensional view. The sacrificial structure 150 comprises a sacrificial material. The sacrificial structure 150 establishes a negative mold for a template structure to be formed subsequently. According to some embodiments of the invention, the sacrificial structure 150 may comprise amorphous silicon as sacrificial material. According to other embodiments of the invention, polymers or other suitable materials can be used that can be removed easily in a subsequent step. According to another suitable embodiment of the invention, the sacrificial material may comprise $Si_xGe_{1-x}$ where x=0 to 1, poly-Silicon or amorphous Silicon or amorphous carbon. This allows the use of a plurality of well-known and established fabrication processes and methods to form the sacrificial structure 150. The sacrificial structure 150 may be deposited in a technology that is particularly suitable for the respective sacrificial material and may have any desired form and shape. Fabrication processes such as lithography and etching processes may be adapted and optimized for the respective sacrificial material.

Figure 6A:
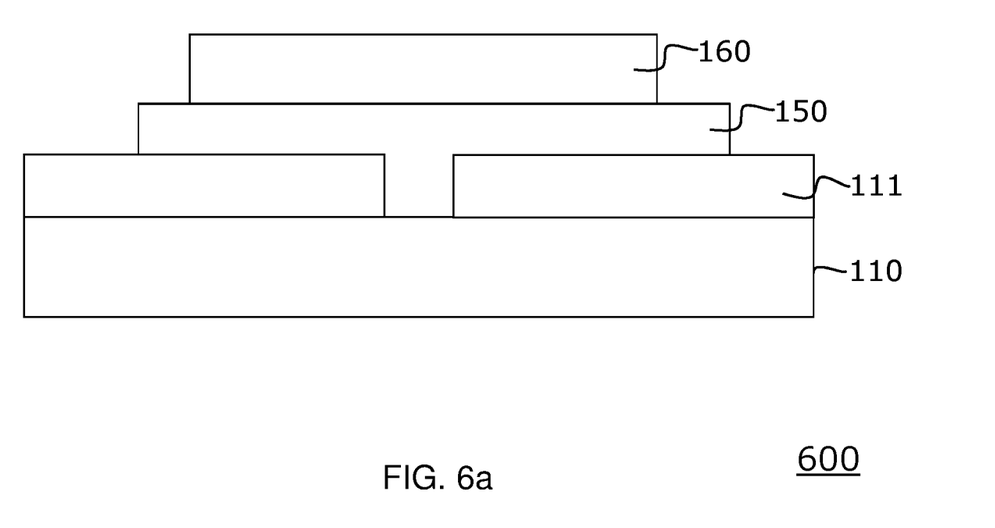
FIG. 6a illustrates a cross sectional view of a structure after a template layer has been formed.
Figure 6B:
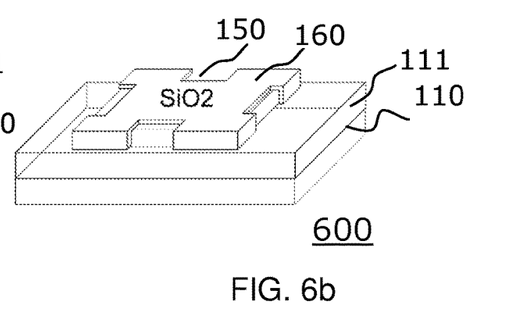
FIG. 6b shows a corresponding 3-dimensional view.

FIG. 6a illustrates a cross sectional view of a structure 600 after a template layer 160 has been formed on the structure 500. FIG. 6b shows a corresponding 3-dimensional view. More particularly, the template layer 160 has been formed on the sacrificial structure 150 and on the insulating layer 111. The template layer 160 is typically an insulating layer, e.g. of an oxide such as silicon oxide or silicon nitride, but might also be a layer of carbon or of other materials which suppress a deposition of the semiconductor during a subsequent selective growth in a template structure. According to an embodiment the template layer 160 may be formed e.g. as blanket oxide layer using conformal deposition techniques as mentioned above.

According to embodiments, the material of the template layer 160 is selected to have a low sticking coefficient, and hence low nucleation probability, for the semiconductor material to be grown in the template structure.

Figure 7A:
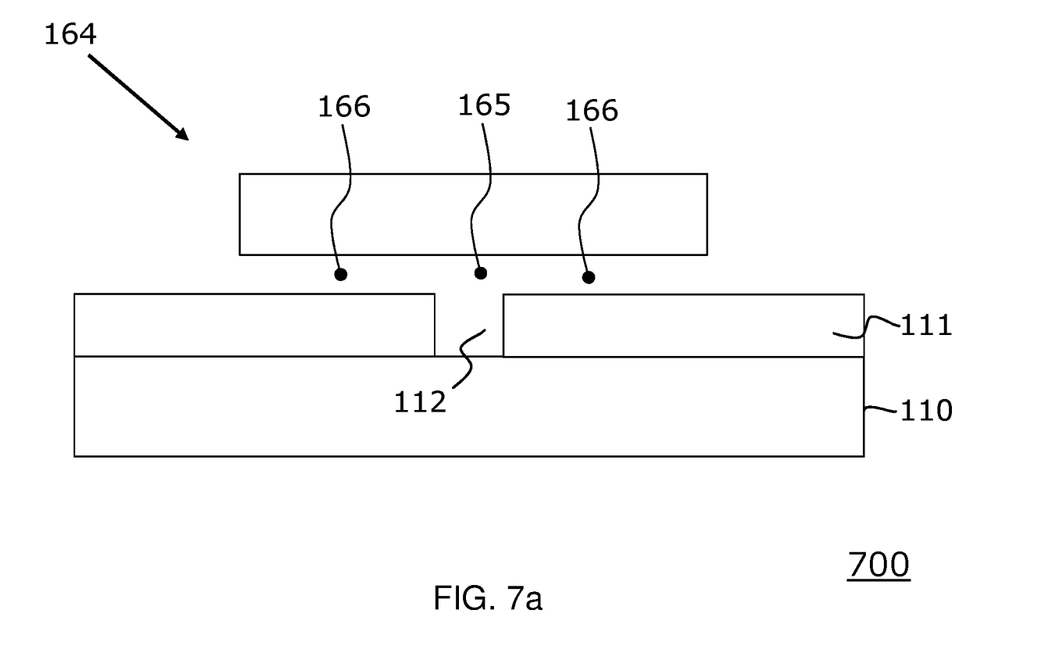
FIG. 7a illustrates a cross sectional view of a structure after the sacrificial material of the sacrificial structure has been selectively removed.
Figure 7B:
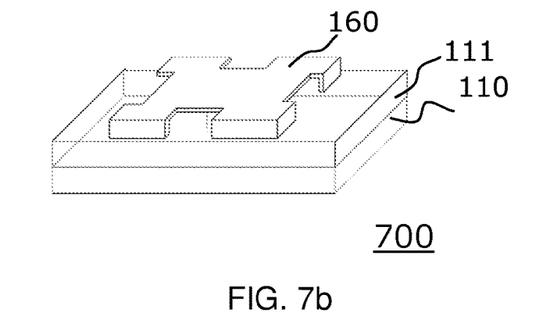
FIG. 7b shows a corresponding 3-dimensional view.

FIG. 7a illustrates a cross sectional view of a structure 700 after the sacrificial material of the sacrificial structure 150 has been selectively removed. FIG. 7b shows a corresponding 3-dimensional view.

This has formed a template structure 164 comprising a template cavity 165 above the insulating layer 111. The template cavity 165 comprises the opening 112 and a lateral growth structure 166 extending laterally over the substrate 110. According to embodiment, the lateral growth structure 166 may also be denoted as radial growth structure as it also extends radially over the substrate 110. The selective removal may be performed by selective etching techniques. The suitable etching technique may depend on the material used as sacrificial material. There are, for example, etching techniques available that selectively remove amorphous silicon as sacrificial material. According to a suitable embodiment the sacrificial material may be $Si_xGe_{1-x}$ and the selective etching may be performed by dry etching with e.g. xenon difluoride ($XeF_2$) or wet etching with e.g. TMAH. In general, the etching technique is chosen to be such that it only etches the sacrificial material of the sacrificial structure 150, but not the material of the template layer 160.

Figure 8A:
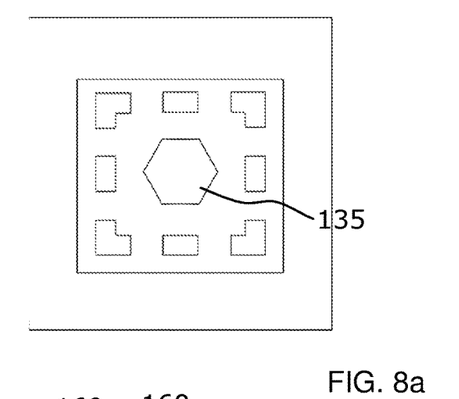
FIG. 8a, shows a top view of a structure after growing from the seed surface of the substrate a semiconductor structure of a semiconductor material.
Figure 8B:
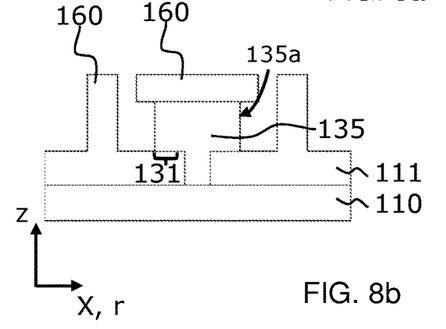
FIG. 8b shows a cross-sectional view of a structure after growing from the seed surface of the substrate a semiconductor structure of a semiconductor material.
Figure 8C:
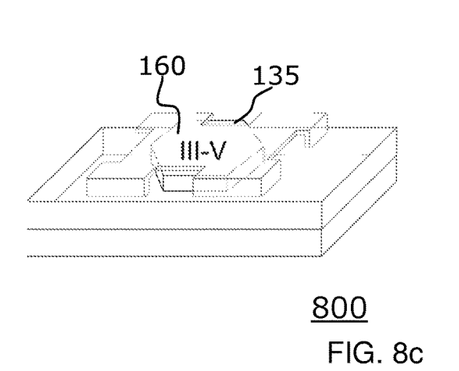
FIG. 8c shows a 3-dimensional view of a structure after growing from the seed surface of the substrate a semiconductor structure of a semiconductor material.

FIGS. 8a, 8b and 8c show a top view, a cross-sectional view and a 3-dimensional view respectively of a structure 800 after growing from the seed surface 114 of the substrate 110 a semiconductor structure 135 of a semiconductor material. The semiconductor structure 135 has been grown first in the opening 112 and subsequently in the lateral growth structure 166. The semiconductor structure 135 provides a vertical seed surface 135a extending in a vertical z-direction for a subsequent growth of quantum wells. The semiconductor material of the semiconductor structure 135 may be in particular a group III-V semiconductor material. The semiconductor structure 135 encompasses a first doped semiconductor layer 131 in the lateral growth structure. This first doped semiconductor layer 131 may be formed in the final stage of the growth of the semiconductor structure 135 by adding dopants to the precursor material. As an example, the semiconductor material of the semiconductor structure 135 may be InP. According to embodiments, the first doped semiconductor layer 131 may be a p-doped or a n-doped semiconductor layer.

Figure 9A:
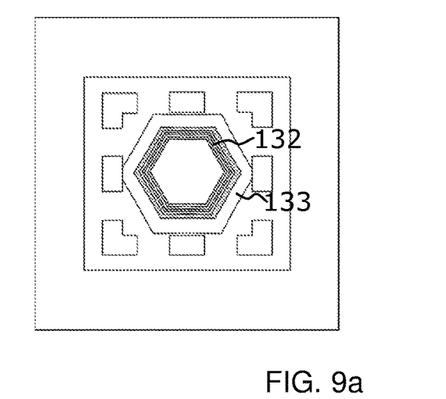
FIG. 9a shows a top view of a structure after growing a plurality of radial shaped quantum wells.
Figure 9B:
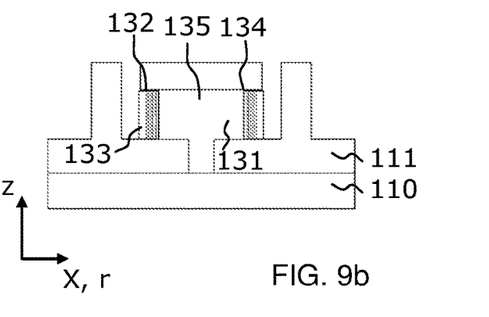
FIG. 9b shows a cross-sectional view of a structure after growing a plurality of radial shaped quantum wells.
Figure 9C:
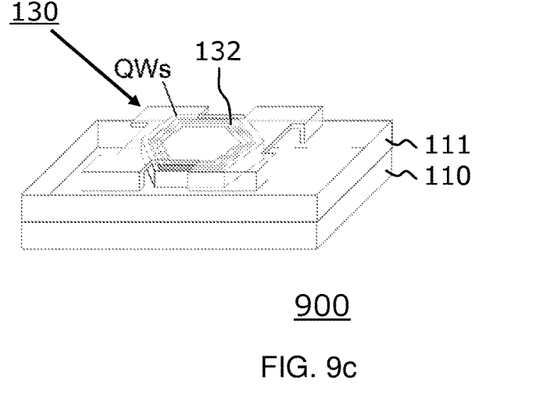
FIG. 9c shows a 3-dimensional view of a structure after growing a plurality of radial shaped quantum wells.

FIGS. 9a, 9b and 9c show a top view, a cross-sectional view and a 3-dimensional view respectively of a structure 900 after growing a plurality of radial quantum wells 132 from the semiconductor structure 135 in the template cavity.

More particularly, the growing of the plurality of quantum wells 132 is performed by growing sequentially in the template cavity in an alternating way a plurality of semiconductor layers of different semiconductor materials. The different semiconductor materials have a different bandgap to facilitate the formation of the quantum wells.

In the following it is assumed, that the semiconductor structure 135 comprises a first semiconductor material, e.g. InP, and the quantum wells a second and different semiconductor material, e.g. InGaAs. The plurality of quantum wells 132 may then be formed as follows. At first, a quantum well 132 of the second semiconductor material is grown on the semiconductor structure 135 of the first semiconductor material. Then a layer 134 of the first semiconductor material is grown on the quantum well 132. The layer 134 may be in particular an intrinsic semiconductor material, e.g. intrinsic InP. Then another quantum well 132 and another layer 134 of an intrinsic semiconductor material may be grown. Finally, a second doped semiconductor layer 133 of opposite polarity to the first doped semiconductor layer 135 is formed on the last grown quantum well 132. The semiconductor structure 135 including the first doped semiconductor layer 131, the quantum wells 132, the layers of the intrinsic semiconductor material 134 and the second doped semiconductor layer 133 form a gain structure 130.

The width of the various layer of the gain structure 130, in particular of the quantum wells 132, in the lateral growth direction x or more particularly in the radial growth direction r can be controlled via one or more growth parameters, in particular by the time of the epitaxial growth.

The growing of gain structure 130 may be in particular performed by metal organic chemical vapor deposition (MOCVD), atmospheric pressure CVD, low or reduced pressure CVD, ultra-high vacuum CVD, molecular beam epitaxy (MBE), atomic layer deposition (ALD) and hydride vapor phase epitaxy.

Figure 10A:
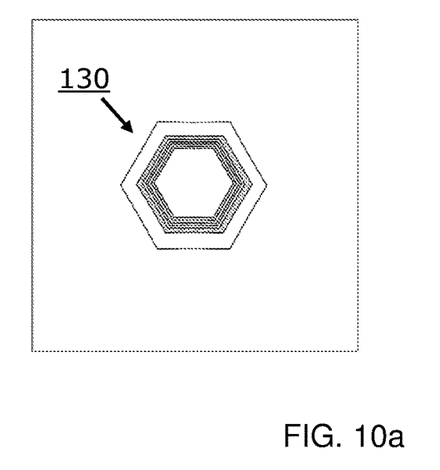
FIGS. 10a, 10b and 10c show a top view, a cross-sectional view and a 3-dimensional view respectively of a structure after selectively removing the template structure.
Figure 10B:
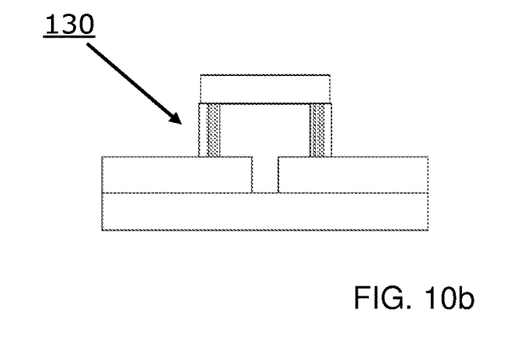
Figure 10C:
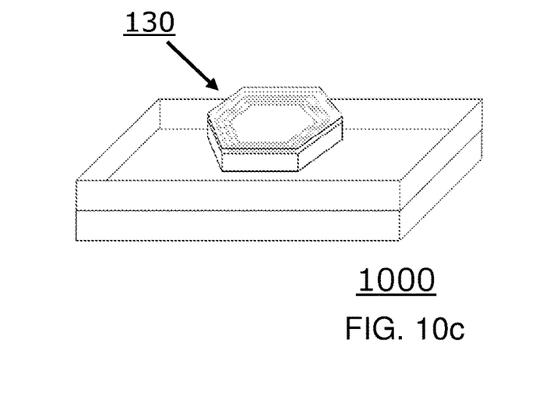

FIGS. 10a, 10b and 10c show a top view, a cross-sectional view and a 3-dimensional view respectively of a structure 1000 after selectively removing the template structure 160, thereby exposing the gain structure 130. The selective removal of the template structure 160 may be performed by lithography and subsequent etching.

Figure 11A:
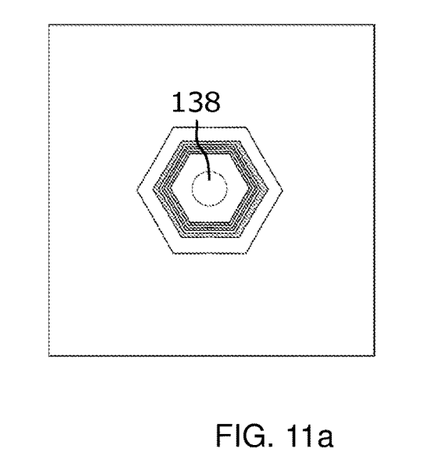
FIG. 11a shows a top view of a structure after a central hole has been formed in the gain structure.
Figure 11B:
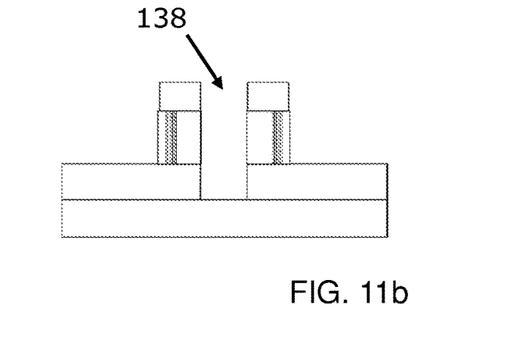
FIG. 11b shows a cross-sectional view of a structure after a central hole has been formed in the gain structure.
Figure 11C:
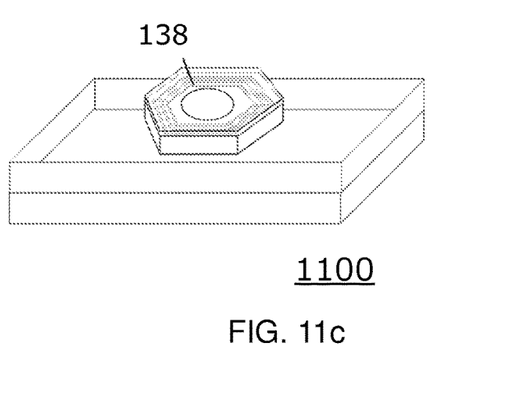
FIG. 11c shows a 3-dimensional view of a structure after a central hole has been formed in the gain structure.
Figure 12A:
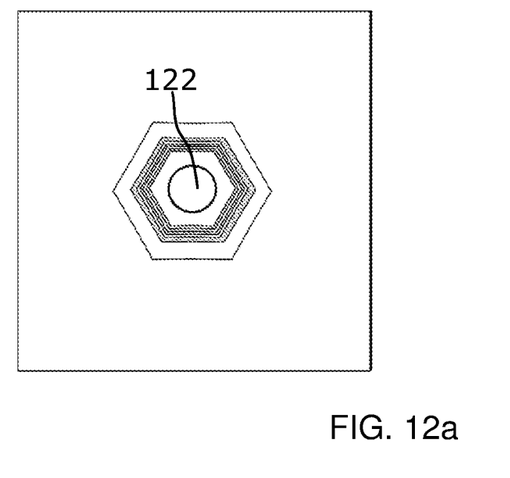
FIG. 12a shows a top view of a structure after the central hole has been filled with a central plasmonic core.
Figure 12B:
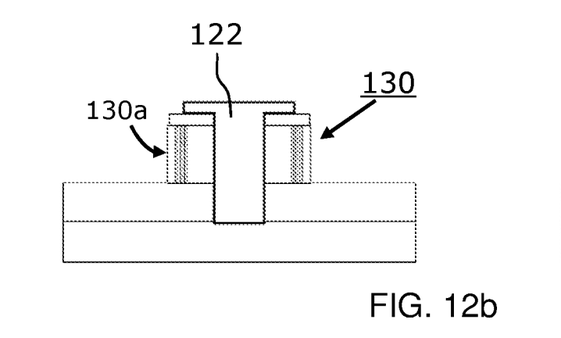
FIG. 12b shows a cross-sectional view of a structure after the central hole has been filled with a central plasmonic core.
Figure 12C:
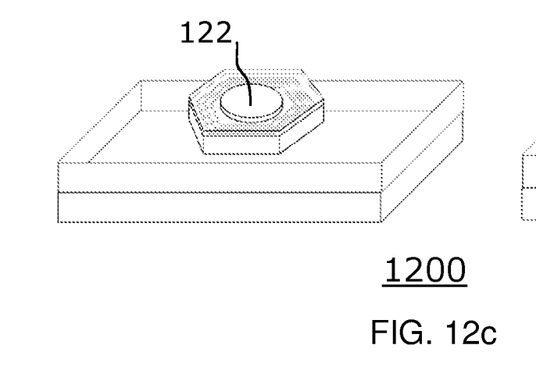
FIG. 12c shows a 3-dimensional view of a structure after the central hole has been filled with a central plasmonic core.

FIGS. 11a, 11b and 11c show a top view, a cross-sectional view and a 3-dimensional view respectively of a structure 1100 after a central hole 138 has been formed in the gain structure 130. The forming of the central hole 138 may be performed by lithography and subsequent etching. The central hole may be circular, or any other convenient shape, such as hexagonal or rectangular FIGS. 12a, 12b and 12c show a top view, a cross-sectional view and a 3-dimensional view respectively of a structure 1200 after the central hole 138 has been filled with a central plasmonic core 122. The central plasmonic core 122 is embodied as a metal plug 122. The metal plug 122 provides an electrical contact to the first doped semiconductor layer 131. This step may be performed e.g. with metal deposition techniques.

Figure 13A:
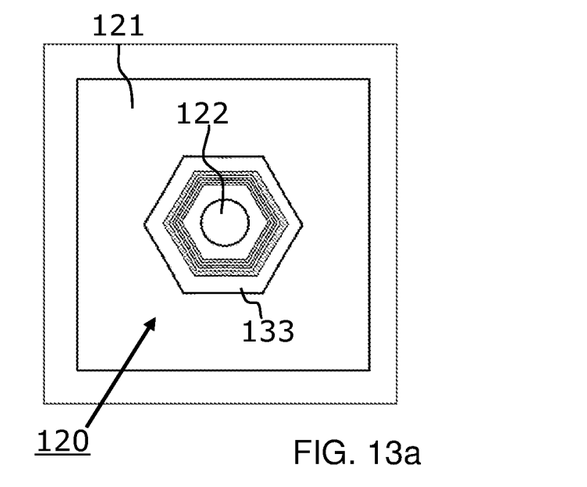
FIG. 13a shows a top view of a structure after a peripheral plasmonic ring structure has been formed all around a vertical edge of the gain structure.
Figure 13B:
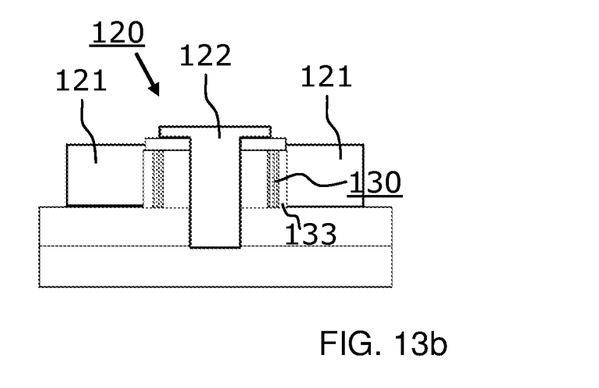
FIG. 13b shows a cross-sectional view of a structure after a peripheral plasmonic ring structure has been formed all around a vertical edge of the gain structure.
Figure 13C:
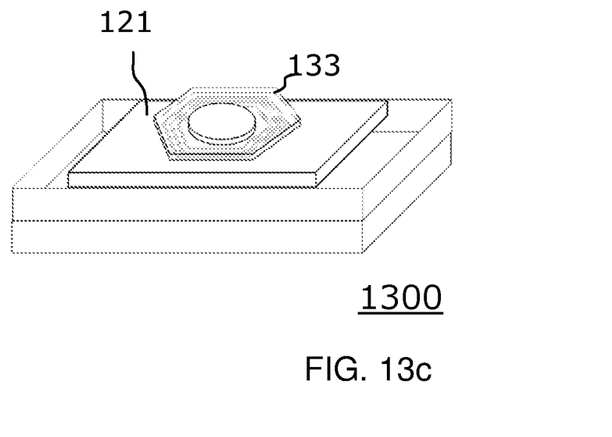
FIG. 13c shows a 3-dimensional view of a structure after a peripheral plasmonic ring structure has been formed all around a vertical edge of the gain structure.

FIGS. 13a, 13b and 13c show a top view, a cross-sectional view and a 3-dimensional view respectively of a structure 1300 after a peripheral plasmonic ring structure 121 has been formed all around a vertical edge 130a of the gain structure 130. The peripheral plasmonic ring structure 121 provides an electrical contact to the second doped semiconductor layer 133. This step may be performed e.g. with metal deposition techniques.

Referring to FIG. 1, the method according to embodiments of the invention may comprise further steps of forming the electrical pumping circuit 140, e.g. by CMOS manufacturing techniques. Further steps may include providing an electrical connection 140a between the electrical pumping circuit 140 and the peripheral plasmonic ring structure 121 and providing an electrical connection 140b between the electrical pumping circuit 140 and the central plasmonic core 122.

Figure 14:
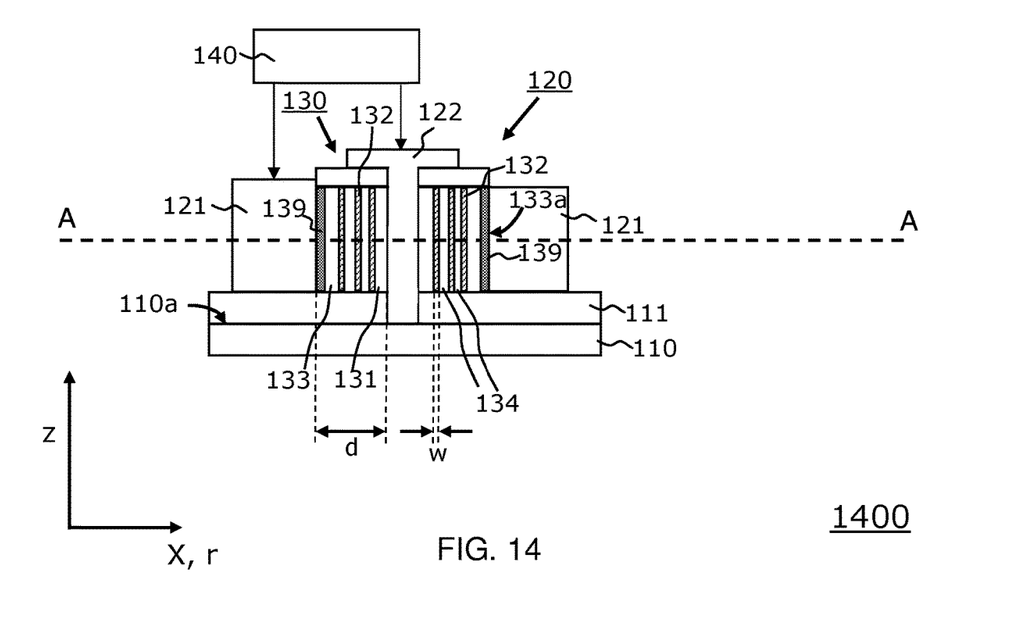
FIG. 14 shows a schematic cross-sectional view of a plasmonic laser configured to generate a hybrid plasmonic mode according to another embodiment of the invention.

FIG. 14 shows a schematic cross-sectional view of a plasmonic laser 1400 according to another embodiment of the invention. The plasmonic laser 1400 corresponds substantially to the plasmonic laser 100 of FIG. 1. Accordingly, same or similar parts are denoted with the same reference numerals.

While the plasmonic laser 100 of FIG. 1 is configured to generate a plasmonic mode, the plasmonic laser 1400 is configured to generate a hybrid plasmonic-photonic mode. This is achieved by providing a thin oxide layer 139 between the peripheral plasmonic ring structure 121 and the gain structure 130. The oxide layer 139 is illustrated by a dotted pattern.

Figure 15A:
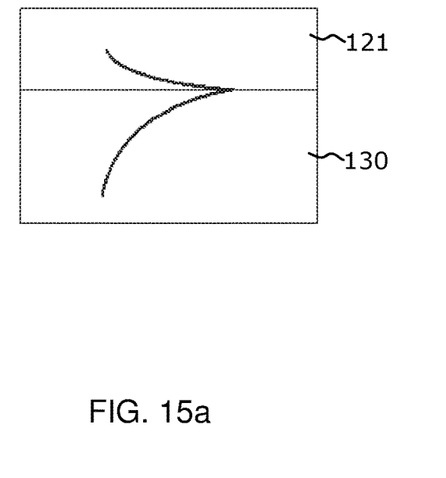
FIG. 15a illustrates the electric field distribution of the SPP in the plasmonic mode laser of FIGS. 1 and 2.
Figure 15B:
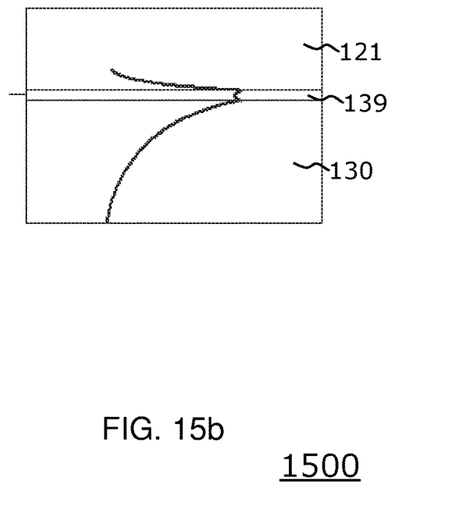
FIG. 15b illustrates the electric field distribution of the SPP in the hybrid plasmonic mode laser of FIG. 14.

FIG. 15a illustrates the electric field distribution of the SPP in the plasmonic mode laser 100 of FIGS. 1 and 2, while FIG. 15b illustrates the electric field distribution of the SPP in the hybrid plasmonic mode laser 1400 of FIG. 14. As can be seen, due to the dielectric layer 139, the electric field distribution of the SPP is changed and shifted towards the gain structure 130.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures can be crystalline seed surfaces but can according to other embodiments also be provided by amorphous surfaces. If the seed has a well-defined crystalline orientation and if the crystal structure of the seed is a reasonable match to that of the growing crystal (for example a III-V compound semiconductor), the growing crystal can adapt this orientation. If the seed is amorphous or has an undefined crystal orientation, the growing crystal will be single crystalline but its crystal orientation will be random.

By appropriate shaping of the sacrificial structure in fabrication processes embodying the invention, template structures and corresponding cavities can be formed with any desired shapes and cross-sectional dimensions.

The disclosed semiconductor structures and circuits can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip may be integrated with other chips, discrete circuit elements, and/or other signal processing devices as part of either an intermediate product, such as a motherboard, or an end product. The end product can be any product that includes integrated circuit chips.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In the interest of brevity and because many steps in the manufacture of semiconductor devices and semiconductor-based ICs are well known, these steps will either be only mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A plasmonic laser comprising:
a substrate;
a coaxial plasmonic cavity formed on the substrate and adapted to facilitate a plasmonic mode; and
an electrical pumping circuit configured to electrically pump the plasmonic laser;
wherein the coaxial plasmonic cavity comprises:
a peripheral plasmonic ring structure;
a central plasmonic core; and
a gain structure being arranged between the peripheral plasmonic ring structure and the central plasmonic core, the gain structure comprising a plurality radial quantum wells arranged concentrically as gain material in which the radial quantum wells are radially separated from one another by an intervening layer, the radial quantum wells having a surface that is aligned orthogonal to a surface of the substrate; and
wherein the electrical pumping circuit is configured to pump the plasmonic laser via the peripheral plasmonic ring structure and the central plasmonic core.

2. A plasmonic laser as claimed in claim 1, wherein the gain structure comprises a doping profile adapted to form a pin-structure.

3. A plasmonic laser as claimed in claim 1, wherein the peripheral plasmonic ring structure and the central plasmonic core are configured to facilitate the excitation and sustention of surface plasmons.

4. A plasmonic laser as claimed in claim 1, wherein the peripheral plasmonic ring structure and the central plasmonic core comprise a material selected from a group consisting of a metal and a doped semiconductor material.

5. A plasmonic laser as claimed in claim 1, wherein:
the quantum wells are formed by quantum well layers of a second group III-V semiconductor material;
the quantum well layers are embedded within cladding layers of a first group III-V semiconductor material to form the intervening layer; and
the first group III-V semiconductor material has a different band gap than the second group III-V semiconductor material.

6. A plasmonic laser as claimed in claim 5, wherein:
the first and the second group III-V semiconductor materials are selected from the pairs consisting of InP and InGaAs; AlGaAs and GaAs; GaAs; and InGaAs.

7. A plasmonic laser as claimed in claim 1, wherein the gain structure comprises:
a positively doped semiconductor layer of a first semiconductor material; and
a negatively doped semiconductor layer of the first semiconductor material;
wherein the quantum wells are arranged between the positively doped semiconductor layer and the negatively doped semiconductor layer; and
wherein the quantum wells comprise a second semiconductor material different from the first semiconductor material.

8. A plasmonic laser as claimed in claim 1, wherein the plasmonic laser is configured to generate a hybrid plasmonic-photonic mode.

9. A plasmonic laser as claimed in claim 8, wherein the plasmonic laser comprises an oxide layer between the peripheral plasmonic ring structure and the gain structure.

10. A plasmonic laser as claimed in claim 1, wherein the plasmonic laser is configured to generate whispering gallery modes.

11. A plasmonic laser as claimed in claim 1, wherein a shape of the quantum wells comprises a hexagonal shape.

12. A plasmonic laser as claimed in claim 1, wherein the central plasmonic core comprises a metal plug.

13. A plasmonic laser as claimed in claim 1, wherein:
the plasmonic cavity comprises a diameter between about 100 nm and about 2 μm; and
the quantum wells comprise a width between about 5 nm and about 20 nm.

14. A method for fabricating a plasmonic laser, the method comprising:
providing a semiconductor substrate;
forming an insulating layer on the semiconductor substrate;
forming an opening in the insulating layer, thereby exposing a seed surface of the semiconductor substrate;
forming a template structure above the insulating layer, the template structure encompassing a template cavity comprising the opening;
epitaxially growing from the seed surface a gain structure in the template cavity, the gain structure comprising a plurality of ring-shaped quantum wells arranged concentrically in which the ring-shaped quantum wells are radially separated from one another by an intervening layer;
selectively removing the template structure;
forming a central hole in the gain structure;
forming a central plasmonic core in the central hole; and
forming a peripheral plasmonic ring structure all around a vertical edge of the gain structure.

15. A method as claimed in claim 14, wherein growing the gain structure comprises growing the ring-shaped quantum wells in the template cavity.

16. A method as claimed in claim 14, wherein growing the gain structure comprises:
growing in the template cavity a first doped semiconductor layer of a first semiconductor material;
growing in the template cavity a quantum well layer of a second semiconductor material on the first doped semiconductor layer; and
growing in the template cavity a second doped semiconductor layer of the first semiconductor material.

17. The method as claimed in claim 14 further comprising growing a plurality of quantum well layers by growing sequentially in the template cavity in an alternating way a plurality of semiconductor layers of a first semiconductor material and a plurality of quantum well layers of a second semiconductor material, the first semiconductor material being different from the second semiconductor material.

18. The method as claimed in claim 14, wherein the growing of the gain structure is performed by one of a metal organic chemical vapor deposition (MOCVD); atmospheric pressure CVD; low or reduced pressure CVD; ultra-high vacuum CVD; molecular beam epitaxy (MBE); atomic layer deposition (ALD); and hydride vapor phase epitaxy.

19. A method as claimed in claim 14, further comprising:
   forming an electrical pumping circuit;
   providing an electrical connection between the electrical pumping circuit and the peripheral plasmonic ring structure; and
   providing an electrical connection between the electrical pumping circuit and the central plasmonic core.

20. The method as claimed in claim 15, wherein the width of the quantum wells in a lateral growth direction is controlled via one or more growth parameters of the epitaxial growth, the one or more growth parameters including a duration of the epitaxial growth.

* * * * *